(12) United States Patent
Tsai et al.

(10) Patent No.: US 12,009,246 B2
(45) Date of Patent: Jun. 11, 2024

(54) SUBSTRATE HOLDER AND METHODS OF USE

(71) Applicant: Taiwan Semiconductor Manufacturing Co., Ltd., Hsinchu (TW)

(72) Inventors: Yu-Chi Tsai, Hsinchu (TW); Chueh-Chi Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 2 days.

(21) Appl. No.: 17/481,007

(22) Filed: Sep. 21, 2021

(65) Prior Publication Data

US 2022/0310432 A1 Sep. 29, 2022

Related U.S. Application Data

(60) Provisional application No. 63/166,808, filed on Mar. 26, 2021.

(51) Int. Cl.
*H01L 21/683* (2006.01)
*G03F 7/00* (2006.01)
*G03F 7/20* (2006.01)

(52) U.S. Cl.
CPC ........ *H01L 21/6833* (2013.01); *G03F 7/2041* (2013.01); *G03F 7/70708* (2013.01)

(58) Field of Classification Search
CPC . H01L 21/6833; G03F 7/2041; G03F 7/70708
See application file for complete search history.

(56) References Cited

U.S. PATENT DOCUMENTS

| | | | |
|---|---|---|---|
| 10,241,422 B2 | 3/2019 | Nakiboglu | |
| 10,719,019 B2 | 7/2020 | Poiesz et al. | |
| 10,761,435 B2 | 9/2020 | Zordan et al. | |
| 10,875,096 B2 | 12/2020 | Lafarre et al. | |
| 10,898,955 B2 | 1/2021 | Lafarre et al. | |
| 2006/0090855 A1* | 5/2006 | Kimura | H01L 21/67109 118/724 |
| 2015/0255316 A1* | 9/2015 | Dobashi | H01L 21/67051 15/316.1 |
| 2016/0320708 A1* | 11/2016 | Lu | G03F 7/7055 |
| 2016/0342096 A1* | 11/2016 | Foad | G03F 1/60 |
| 2021/0276056 A1* | 9/2021 | Prouty | H01J 37/32715 |

\* cited by examiner

*Primary Examiner* — Scott Bauer
(74) *Attorney, Agent, or Firm* — Seed IP Law Group LLP

(57) ABSTRACT

An electrostatic substrate holder for use in an extreme ultraviolet radiation lithography system includes a substrate receiving surface having a plurality of gas passages in fluid communication with a variable gas pressure pump. Varying the pressure in a void space between the backside of the substrate and the substrate receiving surface of the substrate holder promotes removal of non-gaseous materials within the void space between the backside of the substrate and the substrate receiving surface of the substrate holder.

20 Claims, 9 Drawing Sheets

A

B

C

D

E

F

SUBSTRATE HOLDER AND METHODS OF USE

BACKGROUND

The present disclosure relates to the field of ultraviolet and extreme ultraviolet lithography and to substrate holders in ultraviolet and extreme ultraviolet lithography.

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The semiconductor substrate is typically held by a substrate holder on a substrate table. The substrate table can be movable in the x, y and z directions such that the substrate can be moved in such directions relative to the photomask.

DETAILED DESCRIPTION

Figure 1:
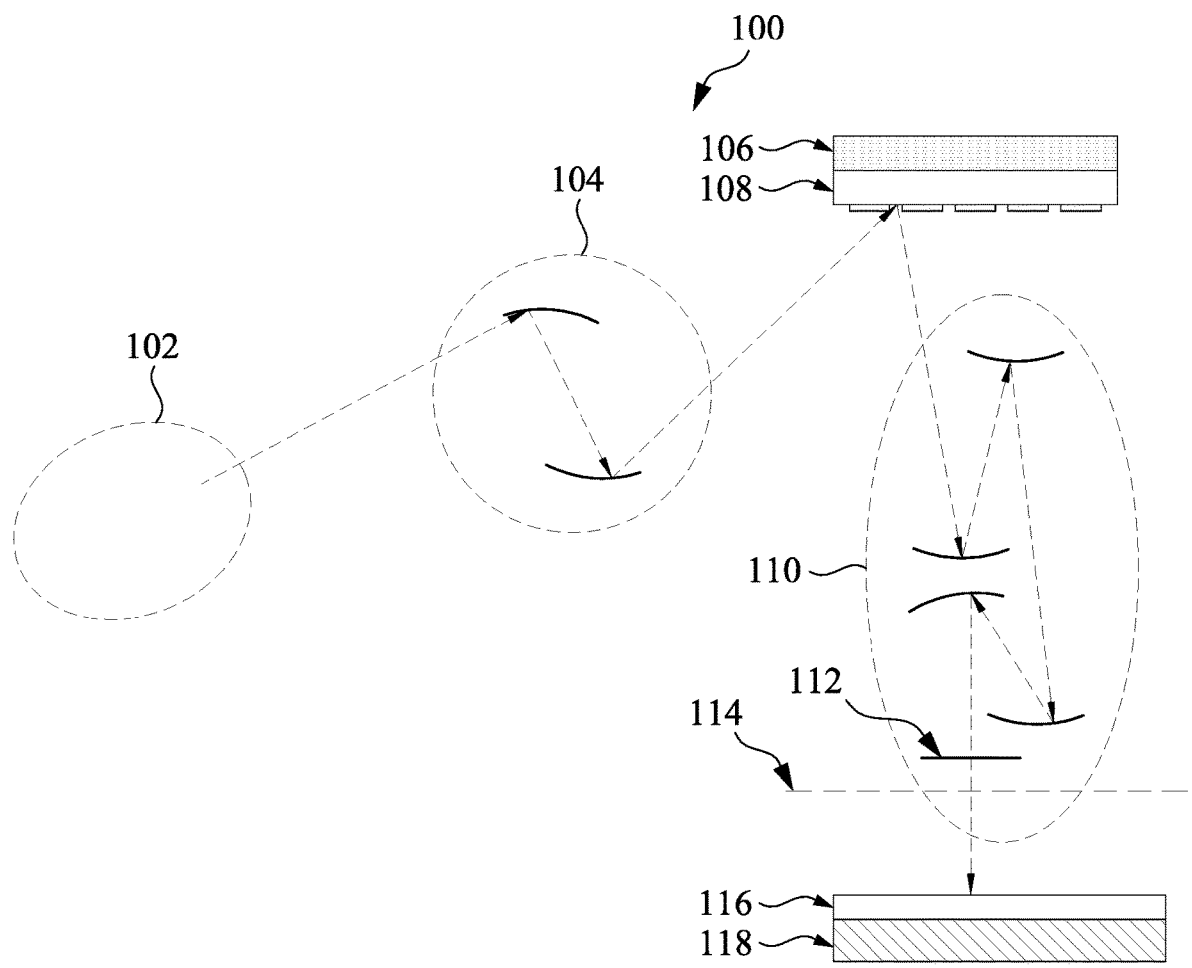
FIG. 1 is a schematic view of a lithography system in accordance with some embodiments of the present disclosure.

In the following description, thicknesses and materials may be described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments in accordance with the present disclosure provide substrate holders suitable for securely and reversibly retaining a substrate on a substrate table of a UV or EUV lithography system. The substrate holders include a self cleaning feature that reduces the likelihood that contaminants will accumulate on the substrate holder and when contaminants do accumulate on the substrate holder they can be removed before they adversely affect a backside of a substrate supported by the substrate holder or adversely affect the exposure process.

The various advantages and purposes of embodiments in accordance with the present disclosure as described above and hereafter are achieved by providing, a lithography system that includes a substrate holder configured to couple a substrate to a support device of the lithography system. The substrate holder includes a plurality of burls and a plurality of openings passing through the substrate holder. One or more of the plurality of openings are in fluid communication with a surface of the substrate holder that receives the substrate. The one or more of the plurality of openings are also in fluid communication with a source of variable gas pressure, e.g., a source for pulling a vacuum, providing a vacuum gas pressure to the plurality of openings. In some embodiments, the support device is coupled to a pedestal that includes a gas flow path which is in fluid communication with one or more of the plurality of openings and in fluid communication with the source of variable gas pressure. Substrate holders in accordance with embodiments of the present disclosure are useful in methods for patterning semiconductor substrates and methods of cleaning substrate holders. Such methods involve adjusting pressure within a void between the backside of the substrate and the substrate receiving surface of the substrate holder where non-gaseous materials may form or accumulate. When the adjustment in pressure results in a vacuum condition in the void, non-gaseous contaminants or particulate material within the void are removed from the void by drawing them through the openings in the substrate holder.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an ultraviolet (UV) lithography system designed to expose a resist layer with UV radiation, i.e., UV light. Inasmuch, in various embodiments, the resist layer includes a material sensitive to the UV light (e.g., a UV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. The following description of a UV photolithography system in accordance with embodiments of the present disclosure refers to extreme ultraviolet radiation as an example of ultraviolet radiation. Embodiments in accordance with the present disclosure are not limited to extreme ultraviolet radiation lithography systems. In other words, embodiments described with reference to extreme ultraviolet lithography systems include embodiments that utilize ultraviolet radiation. A general description of the operation of the lithography system 100 is as follows: EUV light from the radiation source 102 is directed toward the illuminator 104 (which includes a set of reflective mirrors) and is projected onto the reflective mask 108. A reflected mask image is directed toward the projection optics 110, which focuses the EUV light and projects the EUV light onto the semiconductor substrate 116 to expose a EUV resist layer deposited thereupon. Additionally, in various examples, each subsystem of the lithography system 100 may be housed in, and thus operate within, a high-vacuum environment, for example, to reduce atmospheric absorption of the EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. In some embodiments, the radiation source 102 also includes a collector, which may be used to collect EUV light generated from the plasma source and to direct the collected EUV light toward imaging optics such as the illuminator 104.

As described above, EUV light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate (not shown), for example, to improve focus of the EUV light. In some embodiments, the illuminator 104 may be configured to shape the EUV light passing there through in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage (not shown) prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108 within the lithography system. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. As illustrated in FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose a EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

As discussed above, the lithography system 100 also includes the substrate stage 118 to secure the semiconductor substrate 116 to be patterned. Further details of the substrate stage 118 are described below. In various embodiments, the semiconductor substrate 116 includes a semiconductor wafer, such as a silicon wafer, germanium wafer, silicon-germanium wafer, III-V wafer, or other type of wafer. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm2. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein, for example, a cleaning module to clean various components of the lithography system.

The lithography system may include other components and may have other alternatives. In some embodiments, the lithography system 100 may include a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

Figure 2A:
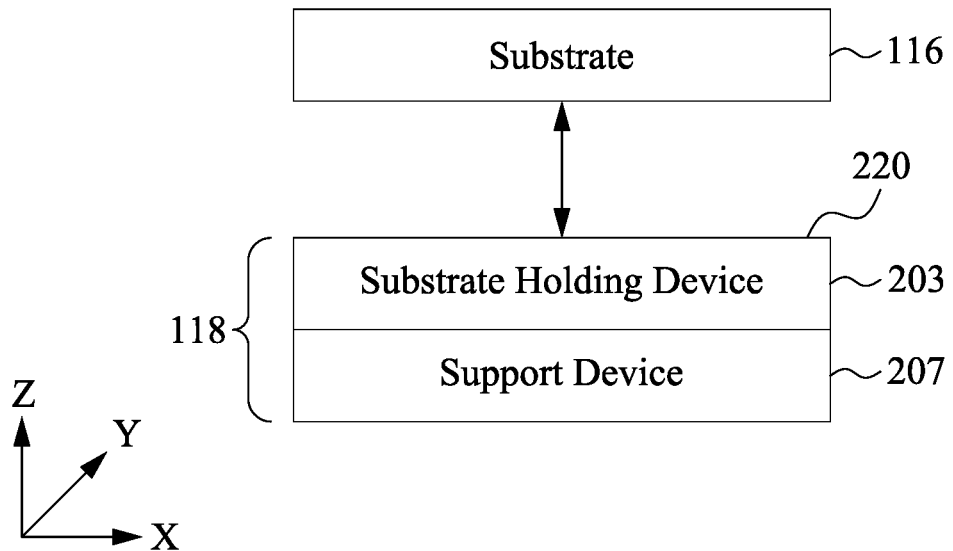
FIGS. 2A and 2B are schematic cross-sectional views of a support device and substrate holder in accordance with embodiments of the present disclosure.

Referring to FIG. 2A, substrate holder system 200 includes a substrate holding device or substrate holder 203 configured to hold a substrate 116, e.g., a semiconductor substrate, on a substrate receiving or contacting surface 220. Substrate holder 203 securely holds substrate 116. At least a portion of the substrate receiving surface 220 contacts an underside of substrate 116. The substrate holder system 200 further includes a support device 207 that supports substrate holder 203. An example of a support device 207 is a wafer table. Support device 207 supports substrate holder 203 and is configured to move substrate holder 203. Support device 207 applies an accelerating force to substrate holder 203 during an accelerating portion of a substrate exposure motion profile and a decelerating force to substrate holder 203 during a decelerating portion of a substrate exposure motion profile. Substrate holder 203 holds substrate 116, such that during a constant velocity portion of a substrate exposure motion profile there is no displacement of the substrate 116 relative to substrate holder 203.

Figure 2B:
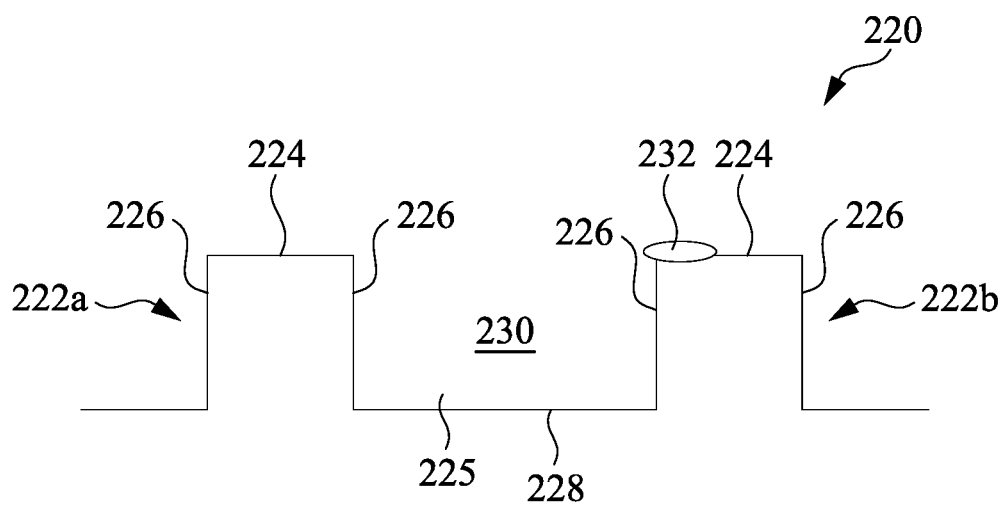

In one example, substrate 116 is releasably held to support device 207 by the substrate holder 203 (e.g., in an EUV lithography system which performs exposure of substrate 116 in a vacuum environment an electrostatic force or electromagnetic force is used to releasably retain substrate 116 on substrate holder 203). Referring to FIG. 2B, a schematic view of a substrate contacting surface 220 of substrate holder 203 includes support surface 222a and support surface 222b. Embodiments in accordance with the present disclosure are described below by referring to support surfaces 222a and 222b as burls. In some embodiments, support surfaces 222a and 222b are burls, but embodiments of the present disclosure are not limited to support surfaces 222a and 222b being burls. In other words, embodiments of the present disclosure include support surfaces 222a and 222b that are not burls. The burls are arranged on the substrate holder 203 in a number circles that are arranged concentrically on the surface of the substrate holder. The number of concentric circles can vary depending on the diameter of the substrate holder. For example, in some embodiments, the number of circles is on the order of 100 and the distance between adjacent circles of burls is about 3-4 millimeters and the distance between adjacent burls of given circle is about 2.5 to 3.5 millimeters. In the embodiment illustrated in FIG. 2B, the burls 222a and 222b are illustrated as having a square or rectangular cross-section shape; however, embodiments of the present disclosure are not limited to burls that have a square or rectangular cross-section shape. For example, the burls may have a cross-section shape that is not square or rectangular, for example the burls can have a cross-sectional shape that is triangular, e.g., the burls may be pyramidal in shape. Burls 222a and 222b each include a top surface 224 and lateral sidewalls 226. Between burls 222a and 222b is a trough 225. The trough 225 includes a bottom surface 228. In FIG. 2B, the top surface 224, lateral sidewalls 226 and bottom surface 228 are part of the substrate contacting surface 220. In use, not every portion of substrate contacting surface 220 directly contacts substrate 116. For example, in some embodiments, only the top surface of burls 222a and 222b contact an underside of substrate 116. The top surface 224 receives and contacts the underside of substrate 116 (not shown in FIG. 2B). When the substrate is placed on the substrate holder 203 and the top surface 224 of the burls 222a and 222b contacts the underside of substrate 116, the bottom surface 228 of trough 225 does not contact the underside of substrate 116 and an open space or void 230 is created between the underside of substrate 116 and bottom surface 228 of trough 225. In the illustration of FIG. 2B, a non-gaseous particle or contaminant 232 is deposited on a top surface 224 of burl 222b. In some embodiments, a non-gaseous particle or contaminant include a solid or a liquid material and not a gas. In other embodiments, a non-gaseous particle or contaminant is a liquid material and not a solid or gas. In other embodiments, a non-gaseous particle or contaminant is a solid material and not a liquid or gas. As described in more detail below, contaminant 232 may be displaced or dislodged from top surface 224 to bottom surface 228 of trough 225 during processing of the substrate 116 or during maintenance or cleaning processes.

Referring back to FIG. 2A, support device 207 is configured to move in an X-direction, a Y-direction, a Z-direction, and Rx, Ry, and Rz rotations. Substrate holder 203 can be coupled to support device 207, e.g., using any bonding technique (such as, but not limited to, an adhesive component, laser or ultrasonic welding, chemical bonding, or a combination thereof), such that support device 207 provides sufficient force to accelerate substrate holder 203 during an acceleration portion of a substrate exposure motion profile, and sufficient force to decelerate substrate holder 203 during a deceleration portion of a substrate exposure motion profile.

In one example, support device 207 may move substrate holder 203 and the releasably held substrate 116, at a high rate of speed and a high rate of acceleration or deceleration. High acceleration and deceleration can generate a lateral shearing force between substrate holder 203 and substrate 116. The shearing force can cause slippage between substrate holder 203 and substrate 116, relative to support device 207. This lateral force can also cause a mechanical hysteresis behavior producing overlay error as the position of substrate 116 relative to support device 207 is not consistent or reproducible. In order to ensure desirable overlay performance, e.g., minimal overlay variance, slippage between substrate holder and substrate 116 should be avoided.

During operation of the lithography system, unwanted particles or contaminants can collect or accumulate on the burls of the substrate holder 203, as illustrated in FIG. 2B. Such unwanted particles can come from a number of sources, including from the generation of the EUV light in radiation source 102 and/or from tools used to clean the substrate holder 203. The accumulation of such contaminants can negatively affect the quality of exposure of the substrate, e.g., photoresist on the substrate, and patterning of the photoresist. For example, such particles may be slightly positively or negatively charged and can affect the electrostatic or electromagnetic force used to retain the substrate 116 on the substrate holder 203. A change in the force used to retain the substrate 116 on the substrate holder 203 can result in poor overlay performance in the exposure process. Accordingly, accumulation of such contaminants on the burls is monitored and when necessary, a cleaning process is conducted to remove the contaminants on the burls. As noted above, the cleaning process itself may generate unwanted particles that can find their way onto the substrate holder.

Figure 3:
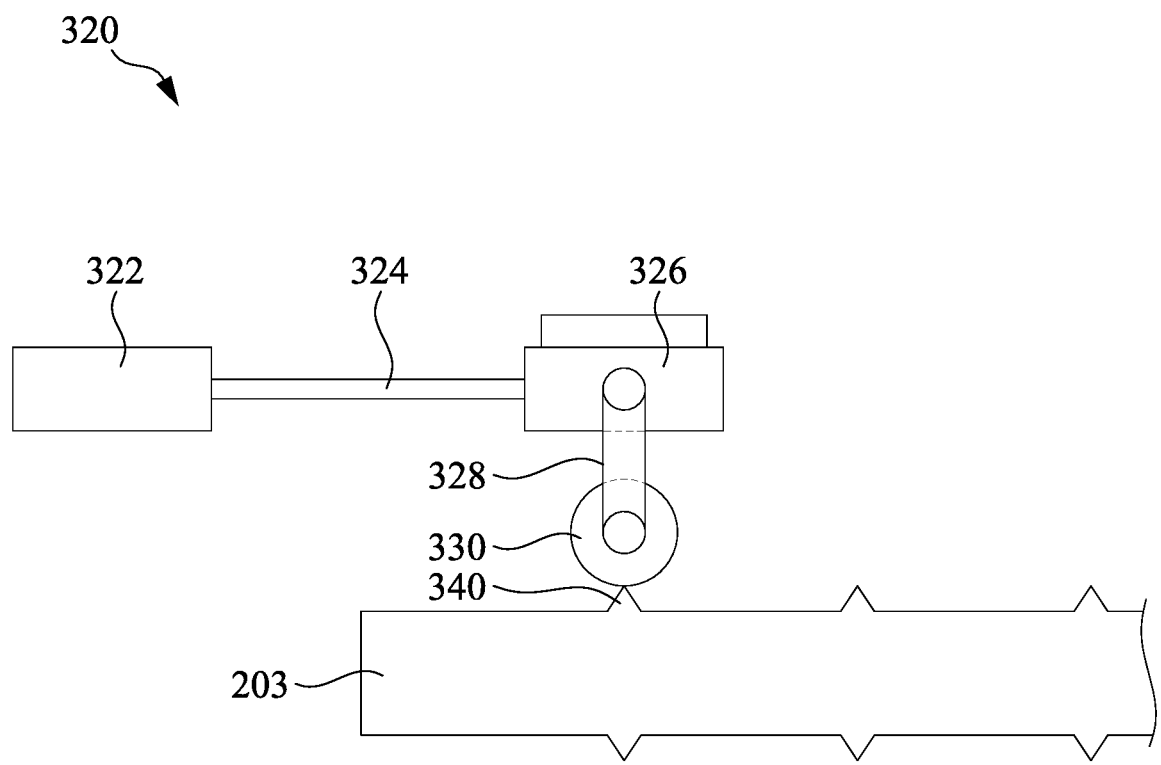
FIG. 3 is a schematic view of a substrate cleaning module of a lithography system useful in accordance with some embodiments of the present disclosure.

FIG. 3 is a schematic view of a substrate holder cleaning module 320 of a photolithography system in accordance with one or more disclosed embodiments. Substrate holder cleaning module 320 is designed to remove contaminants that have accumulated or collected on surfaces of the burls 340, especially the top surfaces of the burls. The burls 340 in FIG. 3 are illustrated as having a triangular cross-section. Substrate holder cleaning module 320 may also be designed to remove contaminants that have accumulated or formed on the sidewalls of the trough between burls. Substrate holder cleaning module 320 includes a base unit 322 supporting an extendable boom 324. Normally the extendable boom 324 is retracted so that it does not obstruct movement of the support device 207, e.g., a substrate table, upon which the substrate holder 203 is supported. The substrate holder cleaning module 320 may be provided at a measurement stage of a dual-stage lithography apparatus, e.g., at a substrate loading/unloading station. At the end of extendable boom 324 is a motor unit 326 connected via drive chain 328 to cleaning wheel 330. The cleaning wheel 330 is an abrasive material, e.g., a granite stone. In some embodiments a cleaning agent may be used in combination with the cleaning wheel 330. Periodically, the substrate holder cleaning module 320 is used to clean one or more burls 340 provided on substrate holder 203. When the extendable boom 324 is extended and the cleaning wheel 330 is driven, the substrate holder 203 is moved so that a burl to be cleaned is positioned under the cleaning wheel 330. Alternatively, the extendable boom 324 can be moved resulting in the cleaning wheel 330 being moved relative to the surface of the substrate holder 203. In some embodiments, when the substrate holder 203 is round, during a burl cleaning operation, the cleaning wheel 330 is moved over the substrate holder 203 in a circular direction starting from an outer perimeter of the substrate holder 203. In other embodiments where the substrate holder 203 is round, the cleaning wheel 330 is moved over the substrate holder 203 in a circular direction starting from the center of the substrate holder 203 and working outward to the outer perimeter of the substrate holder 203.

In an embodiment, the substrate holder cleaning module 320 is operated in a first mode in which each cleaning operation cleans a small number of burls, e.g., from one to five burls, and takes a short period of time, e.g., from 20 to 100 seconds. The cleaning operation may be carried out a predetermined number, e.g., from 5 to 40, times per day. In an embodiment, the substrate holder cleaning module 320 can be operated in a second mode in which the entire substrate holder is cleaned. The second mode cleaning operation may take between 5 and 10 minutes and may be carried out relatively infrequently, e.g., at a frequency from about one time per week to about three times per day.

Figure 4A:
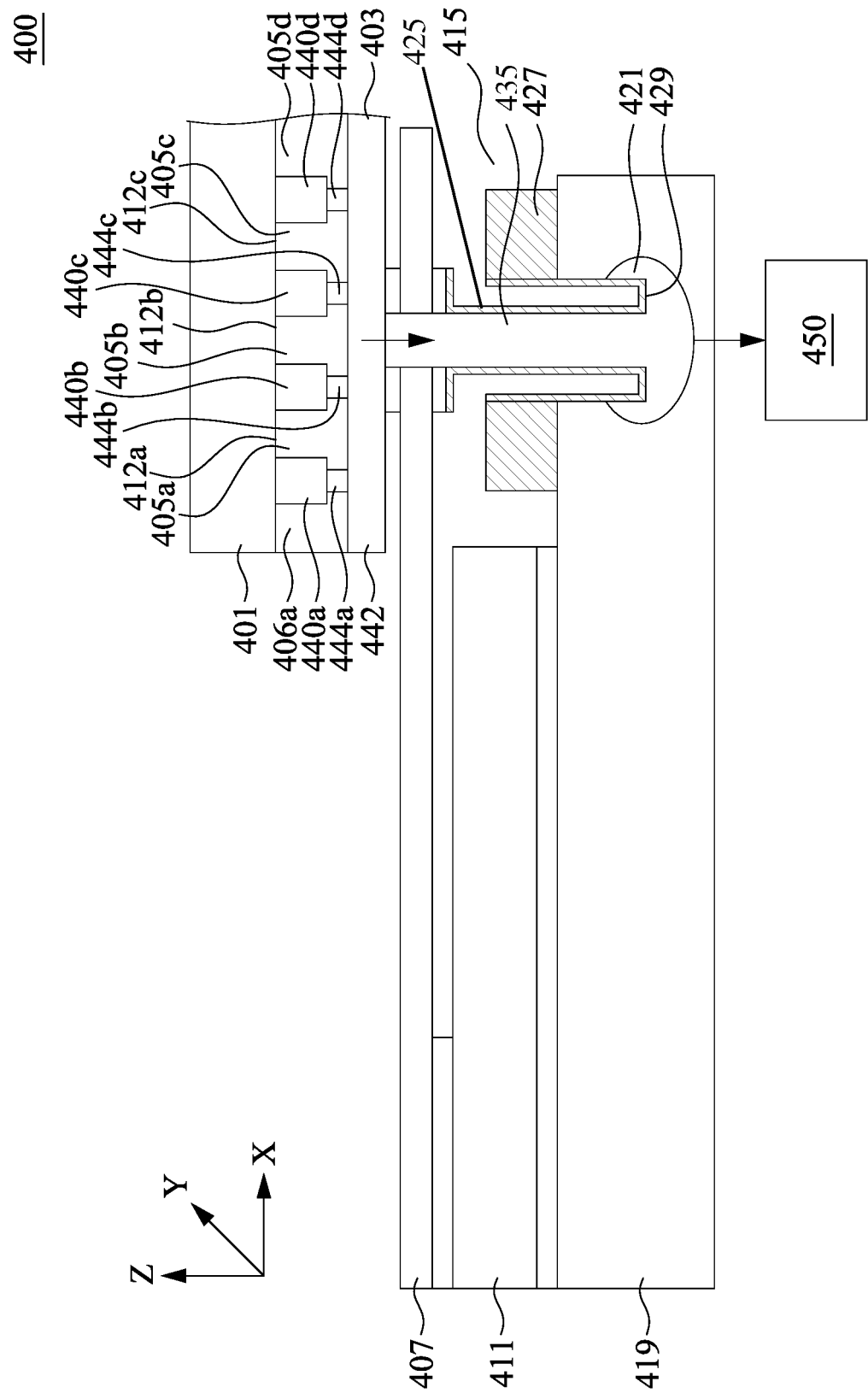
FIG. 4A is a schematic cross-sectional view of a substrate holder system in accordance with embodiments described herein.

FIG. 4A illustrates a schematic of a cross-sectional view of a substrate holder system 400 including a support system, according to an embodiment of the present disclosure.

In the example of FIG. 4A, substrate holder system 400 includes a substrate holder 403 to hold substrate 401, support device including first and second support device portions 407 and 411, a support transport device 419 and support system 415. The substrate holder 403, support device portions 407 and 411, support transport device 419, and support system 415 are coupled together, for example, using any bonding technique (such as, but not limited to, adhesives, laser or ultrasonic welding, chemical bonding, or a combination thereof).

In an example, substrate 401 (e.g., a semiconductor substrate or wafer) is coupled to substrate holder 403 by a variety of means (e.g., electro-magnetic, electrostatic, and combinations thereof). Substrate holder 403 is coupled to first support device portion 407, for example with adhesive laser or ultrasonic welding, chemical bonding, or a combination thereof. In one example, first support device portion 407 can provide the stiffness and positioning in the X and Y directions while allowing compliance in the Z direction as to not deform substrate 401. In other words, first support device portion 407 can be designed to be stiff in the X and Y directions while flexible in the Z direction. In other embodiments, first support device portion 407 can provide the stiffness and positioning in the X, Y and Z directions. In other words, first support device portion 407 can be designed to be stiff in the X, Y and Z directions.

First support device portion 407 is coupled to the second support device portion 411, for example, with adhesive, laser or ultrasonic welding, chemical bonding, or a combination thereof. However, it is noted that other designs can be used to couple first and second support device portions 407 and 411.

Second support device portion 411 is further coupled to support transport device 419, for example using adhesive, laser or ultrasonic welding, chemical bonding, or a combination thereof. Alternatively, the substrate holder 403, support device portions 407 and 411, support transport device 419, and support system 415 can be coupled together using other bonding techniques.

According to some embodiments, substrate holder 403 of substrate holder system 400 can include a plurality of burls 405a-405d. In the embodiment of FIG. 4A, only a portion of substrate holder 403 and substrate 401 is illustrated. In one example, substrate 401 is coupled to or supported on upper surfaces 412a, 412b and 412c of the plurality of burls 405a-405d of substrate holder 403. Although only four burls are shown in FIG. 4A, it is noted that the plurality of burls 405a-405d can include any number of burls. In some embodiments, using the plurality of burls 405a-405d can improve shear stress uniformity. In one example, the plurality of burls 405a-405d can have a design and a pattern such that the plurality of burls can create a distributed, uniform and compliant layer at the contact surface between substrate 401 and substrate holder 403. Further, the height, the shape, the size, and/or the stiffness of the plurality of burls 405a-405d can be optimized to create a distributed, uniform and compliant layer at the contact surface. According to some embodiments, described below in more detail, the plurality of burls 405a-405d can be made by etching substrate holder 403 using a mask provided with the design and the pattern of the plurality of burls.

According to some embodiments, substrate holder 403 can also include a seal 406 at the outer edges of substrate holder 403. In FIG. 4A, a portion 406a of seal 406 is shown. It is understood that seal 406 can extend to be at one outer edge (when the substrate holder is round or oval), two outer edges (along Y direction or X direction), at three outer edges, at four outer edges or at all edges of substrate holder 403. In some embodiments, seal 406 can include a continuous seal around the perimeter of substrate holder 403. However, the embodiments of this disclosure are not limited to this example. In this example, seal 406 has a height substantially the same as the plurality of burls 405a-405d. Accordingly, seal 406 can contact an underside of substrate 401 when substrate 401 is on the plurality of burls 405a-405d. Seal 406 and burl 405a are separated by a channel 440a extending into the upper surface of substrate holder 403. Burls 405a and 405b are separated by a channel 440b extending into the upper surface of substrate holder 403. Burls 405b and 405c are separated by a channel 440c extending into the upper surface of substrate holder 403. Burl 405c and burl 405d are separated by a channel 440d extending into the upper surface of substrate holder 403.

In one example, each one of the plurality of burls 405a-405d can have a height of about 150 micrometers and a diameter of about 300 micrometers. According to some embodiments, the plurality of burls 405a-405d can have a burl pitch of about 3.87 mm (in X direction) and about 2.96 mm (in Y direction.) However, it is noted that the plurality of burls 405a-405d can have other heights, shapes, diameters, and/or burl pitches.

Figure 4B:
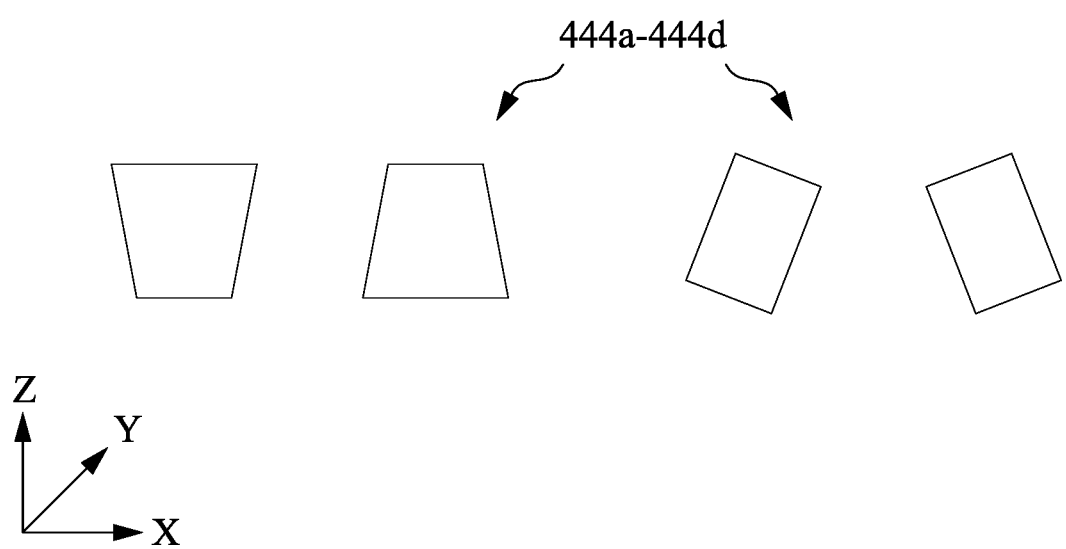
FIG. 4B is a schematic cross-sectional view of several fluid passages in accordance with embodiments described herein.

In FIG. 4A, substrate holder 403 includes a plenum or vacuum chamber 442 occupying a portion of substrate holder 403 below channels 440a-440d. In the embodiment illustrated in FIG. 4A, vacuum chamber 442 is also below burls 405a-405d and seal 406a; however, embodiments in accordance with the present disclosure are not limited to vacuum chamber 442 being below burls 405a-405d and seal 406a. For example, in other embodiments, vacuum chamber 442 can be one or more channels in the lower portion of substrate holder 403 that are in fluid communication with vacuum hole or chamber 435 in pedestal 425. In other embodiments, vacuum chamber 442 does not occupy the entire lower portion of substrate holder 403. Extending between vacuum chamber 442 and each one of channels 440a-440d is a fluid passage 444a-444d, respectively. Fluid passages 444a-444d provide fluid communication between vacuum chamber 442 and channels 440a-440d. Accordingly, channels 440a-440d are in fluid communication with vacuum channel 421 which allows a vacuum to be established in channels 440a-440d. In the embodiment of FIG. 4A, fluid passages 444a-444b have a cross-section in the X-Y plane that is polygonal or non-polygonal, for example, the cross-section of fluid passages 444a-444d in the X-Y plane can be round, oval, square, rectangular, pentagonal or triangular. In the embodiment of FIG. 4A, a longitudinal axis of the fluid passages 444a-444d are parallel to the Z axis and the cross-section of the fluid passages is constant along the Z axis. In other embodiments as illustrated in FIG. 4B, the cross-section of the fluid passages 444a-444d is not constant along the Z axis. For example, the cross-sectional area of the fluid passages varies, i.e., can increase or decrease along the Z axis. For example, in one embodiment, the cross-sectional area of the fluid passage increases along the Z axis. In other embodiments, the cross-sectional area of the fluid passage decreases along the Z axis. In other embodiments, as illustrated in FIG. 4B, the longitudinal axis of the fluid passages is not parallel to the Z axis and instead forms an angle with the Z axis.

Additionally or alternatively, substrate holder system 400 includes a support system 415. Support system 415 provides support in the Z, X and Y direction for substrate holder 403 and substrate 401. In the embodiment illustrated in FIG. 4A, support device 415 can include a pillar 425 and a holder 427. It is noted that although some exemplary designs for support system 415 are provided, the embodiments of this disclosure are not limited to these designs. This support system can provide a better controlled thickness in the layers relevant for the positioning in the Z direction of the patterning device. Pillar 425 and holder 427 are connected to each other at 429. In one example, pillar 425 and holder 427 can be coupled to each other at 429 using different means, such as, but not limited to, welding. Pillar 425 can be coupled to first support device portion 407 using any means such as, but not limited to, adhesive 431. Holder 427 can be coupled to support transport device 419 using any means such as, but not limited to, an adhesive. In one example, a layer of adhesive can be applied between the top surface of support transport device 419 and a bottom surface of holder 427. Accordingly, support system 415 is configured to support first support device portion 407 (and therefore, substrate holder 403) on second support device portion 411.

In the embodiment illustrated in FIG. 4A, holder 427 is fixed to support transport device 419. Pillar or pedestal 425 is coupled to holder 427 at one end 429. Pillar 425 can be made in the shape of a cylinder that has a vacuum hole/channel 435 inside. It is noted however, other material and/or shapes can be used to make support system 415. The length of pillar 425 along with the fact that pillar 425 can pivot around the connection 429, can provide a flexure function of pillar 425.

According to some embodiments, support system 415 can be coupled to a vacuum channel 421 in support transport device 419. Vacuum channel 421 of support transport device 419 can be coupled to a vacuum pump 450 in a manner that would be apparent to a person of ordinary skill in the art. When substrate 401 is to be coupled with substrate holder 403 using vacuum, the pump (e.g., a vacuum pump 450) can remove the air between substrate 401 and substrate holder 403 through vacuum channel 421 and support system 415. For example, pillar 425 of support system 415 can include vacuum channel 435 that will be coupled to vacuum channel 421 to remove the air from between substrate 401 and substrate holder 403.

Figure 4C:
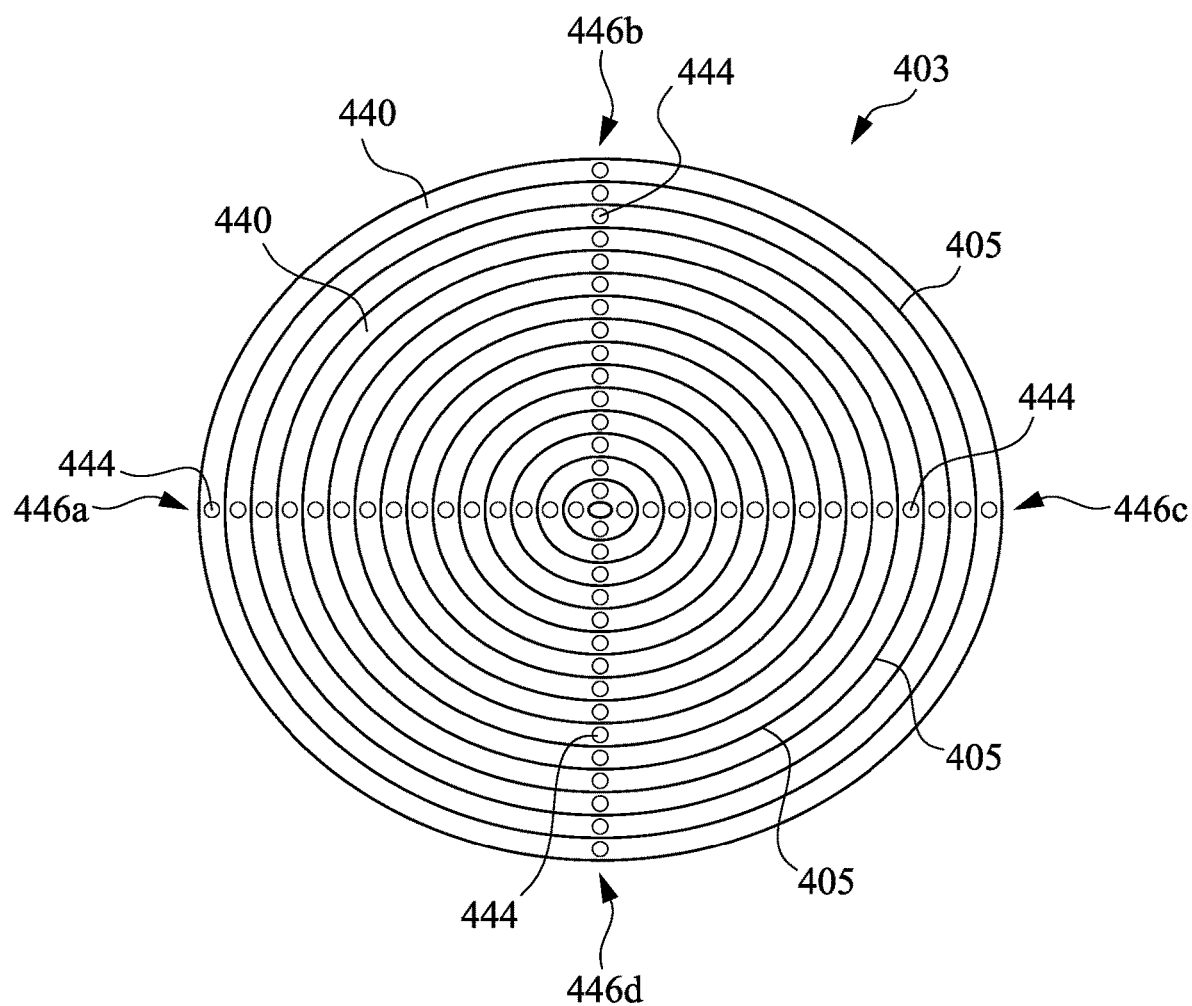
FIG. 4C is a top schematic view of a substrate holder in accordance with embodiments of the present disclosure.

Referring to FIG. 4C, a top view of an upper surface of a substrate holder 403 is schematically illustrated. The upper surface of substrate holder 403 includes a plurality of circles that each include a plurality of burls 405 and channels 440 between adjacent circles of burls 405 as described above. In the embodiment illustrated in FIG. 4C, the fluid passages 444 described above are positioned at various locations between adjacent circles of burls 405, e.g., in the trenches or channels between adjacent circles of burls. More specifically, in the embodiment of FIG. 4C, the fluid passages 444 are positioned between adjacent circles of burls 405. In the embodiment of FIG. 4C, the fluid passages 444 are arranged in four rows 446a-446d of aligned fluid passages 444. The four rows 446a-446d are separated by 45° around the circular substrate holder 403. Embodiments in accordance with the present disclosure are not limited to the fluid passages being aligned in four rows separated by 45° around a circular substrate holder. In other embodiments, fewer rows 446 are present or a larger number of rows 446 are present. In addition, in other embodiments, the fluid passages 444 need not be present in aligned rows. For example, the fluid passages may be arranged in a different pattern, for example, an arcuate, angular or serpentine pattern. In addition, in the embodiment of FIG. 4C, fluid passages 444 are present in each channel 440 between each of the adjacent circles of burls 405. Embodiments in accordance with the present disclosure are not limited to fluid passages 444 being present in each channel 440 between each of the adjacent burls 405. For example, in other embodiments, the fluid passages are not in each channel 440 between each of the adjacent burls 405. For example, the fluid passages 444 can be present between every other channel 440 or in less than every other channel 440.

In other embodiments, fluid passages 444 are located between adjacent burls 405 of a given circle of burls 405, instead of being located within the trough or channel 440 between adjacent circles of burls 405. In such embodiments, the diameter of fluid passages 444 is slightly less than the distance between adjacent burls 405 of a given circle. For example, in such embodiments, fluid passages 444 have a diameter that is less than about 3.5 mm or a diameter that is less than about 2.5 mm. Embodiments in accordance with such embodiments are not limited to fluid passages 444 having such diameters. For example, when the distance between adjacent burls 405 of a given circle is greater than 3.5 mm, the diameter of the fluid passage 444 between such adjacent burls 405 can be greater than about 3.5 mm and less than the distance between the adjacent burls 405 of the circle. The fluid passages 444 should have a diameter that is sufficient to permit a large percentage of non-gaseous particles or contaminants that collect on the substrate receiving surface 222 of the substrate holder 203 to pass through the fluid passages 444.

The diameter of fluid passages 444 can vary. In some embodiments, the diameter of fluid passages is slightly less than the distance between adjacent circles of burls 405. For example, fluid passages 444 can have a diameter that is less than about 2 mm, less than about 3 mm or less and about 4 mm. Embodiments in accordance with the present disclosure are not limited to fluid passages having such diameters, for example, fluid passages 444 can have a diameter greater than about 4 mm.

Figure 5:
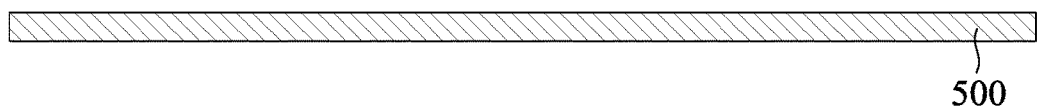
FIG. 5 illustrates various steps in forming a substrate holder in accordance with embodiments of the present disclosure.
Figure 5:
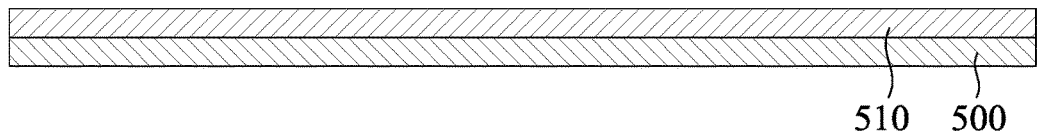
Figure 5:
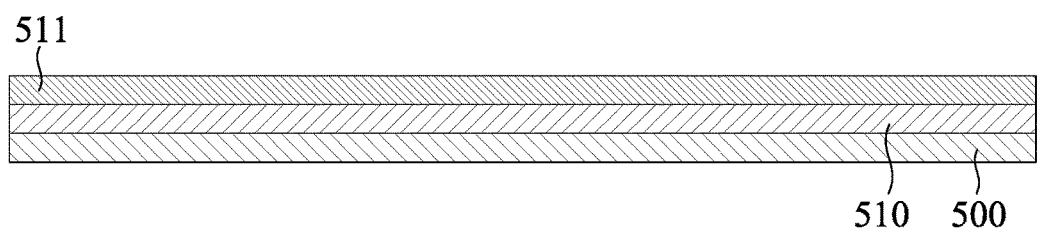
Figure 5:
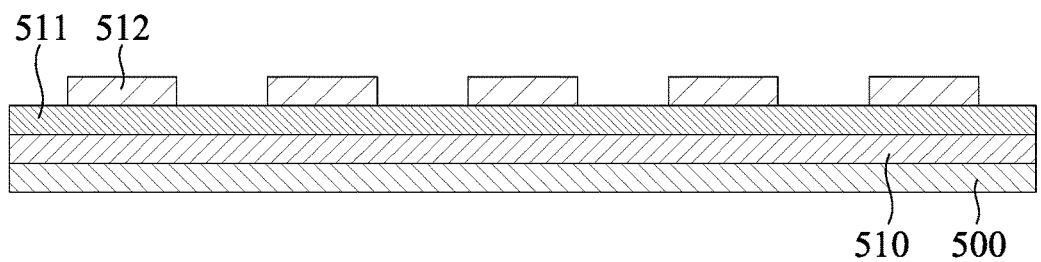
Figure 5:
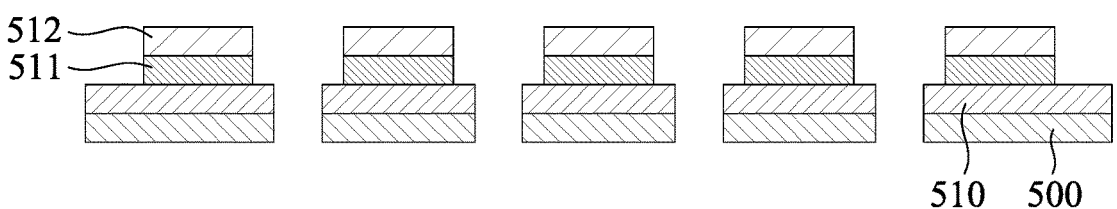
Figure 5:
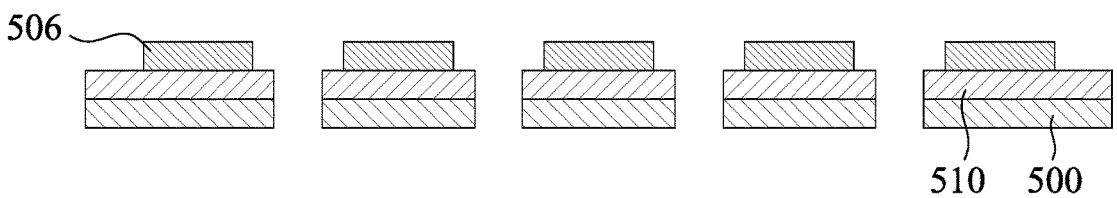

FIG. 5 shows steps A to F of a method to form a substrate holder according to an embodiment of the invention. Starting with a flat blank of suitable shape and thickness to form the substrate holder 500 shown in A, a thin-film stack 510 is formed, as shown in B. The thin-film stack can be formed in several sub-steps. The first sub-step is to form a bottom isolation layer on the surface of the substrate holder 500. As mentioned above, this may include providing several thin-film layers of isolation material (e.g., to reduce or eliminate pinholes and cracks). Such a method can maintain and ensure the smoothness of the surface on which one or more layers may be formed.

The second sub-step is to form one or more various different components as described below. The formed layer may be a patterned layer of, for example, conductive material. The conductive material desirably includes a metal. This second sub-step may itself comprise a series of sub-steps, for example lithographic patterning and etching. The patterning and etching may pattern the layer to form the one or more components in the layer.

The third sub-step is to form the top isolation layer on top of the metal pattern. The top isolation layer electrically isolates the patterned conductive layer from electrical conduction to an object applied from above or a short circuit to another part of the patterned layer. Again, this may include providing several thin-film layers of isolation material. Depending on the complexity of the component, one or more further conductive and isolating layers may be applied.

Next, as shown at C, a layer of burl-forming material 511 is provided on the thin-film stack 510. The layer of burl-forming material is to be patterned to form the burls in one or more subsequent steps of the method. The burl-forming material can be selected from the group comprising diamond such as diamond-like carbon (DLC), SiC, $SiO_2$, TiN and CrN. To form the burls from layer 511, a patterned metal mask 512 is formed on the top isolation layer as shown at D. This may be achieved via a combination of metal layer and photo-resist deposition and lift-off via lithography and selective etching. Then, layer 511 is dry etched, for example, by directing a plasma (e.g., oxygen and/or fluorine) through the metal mask 512. Then fluid passages 444a-444d are formed through layers 510 and 500 by a combination of photo-resist deposition, lithography and selective etching to arrive at the state shown at E. In the state shown in E, the parts of the layer of burl forming material 511 which are not covered by the patterned metal mask are removed, e.g., etched, away. The top of the thin-film stack 510, i.e., a top surface of an isolation layer, is thus revealed from under the layer of burl forming material. Removal of the metal mask by a conventional method leaves the finished substrate holder as shown in F. If desired, a coating can be provided on top of the burls 506. It is possible to adjust or correct the shape and/or profile of the burls using, for example, ion beam figuring. The structure in FIG. 5 is combined with plenum 442 in FIG. 4A to provide the fluid communication between channels 440*a*-440*d* in FIG. 4A and vacuum channel 421 in FIG. 4A.

Figure 6:
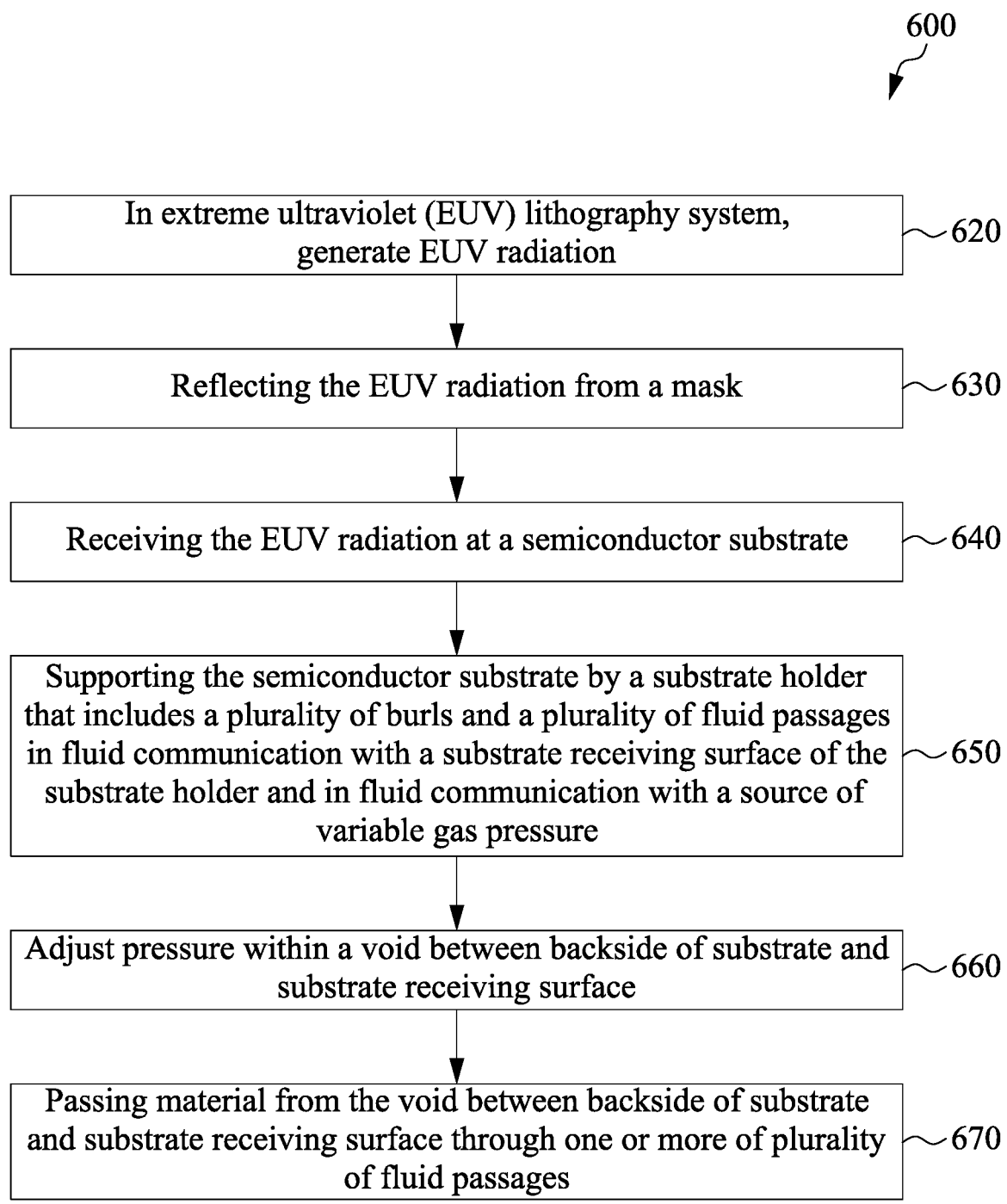
FIG. 6 is a flowchart illustrating a method in accordance with an embodiment of the present disclosure.

Referring to FIG. 6, a method 600 in accordance with embodiments of the present disclosure for cleaning a surface of a substrate holder in an EUV photolithography system is illustrated and described with reference to FIGS. 1, 2A, 2B and 4A. The method includes generating EUV radiation in step 620. EUV radiation can be generated, for example, utilizing the radiation source 102 of FIG. 1 as described above. The EUV radiation is reflected from a mask at step 630. An example of a mask suitable for reflecting the EUV radiation is mask 108 described above. Mask 108 reflects EUV radiation as described above. At step 640, EUV radiation is received at a semiconductor substrate. An example of a semiconductor substrate is semiconductor substrate 116 described above. Method 600 includes step 650 of supporting a semiconductor substrate by substrate holder that includes a plurality of burls and a plurality of fluid passages in fluid communication with a substrate receiving surface of a substrate holder and in fluid communication with a source of variable gas pressure. An example of a substrate holder useful in step 650 includes substrate holder 203 described above which includes burls 405*a*-405*d* and channels 440*a*-440*d*. An example of a substrate receiving surface of a substrate holder is substrate contacting surface 220 of substrate holder 203 in FIG. 2B. Fluid passages 444*a*-444*d* in FIG. 4A are examples of fluid passages of the method 600. An example of a source of variable gas pressure is vacuum pump 450 described above. At step 660 of method 600, pressure within a void between the backside of the substrate and the substrate receiving surface is adjusted. An example of a void between the backside of the substrate and the substrate receiving surface include channels 440*a*-440*d* described above. Step 670 of method 600 includes passing a non-gaseous material from the void between the backside of the substrate and the substrate receiving surface through one or more of the plurality of fluid passages in the substrate holder.

Figure 7:
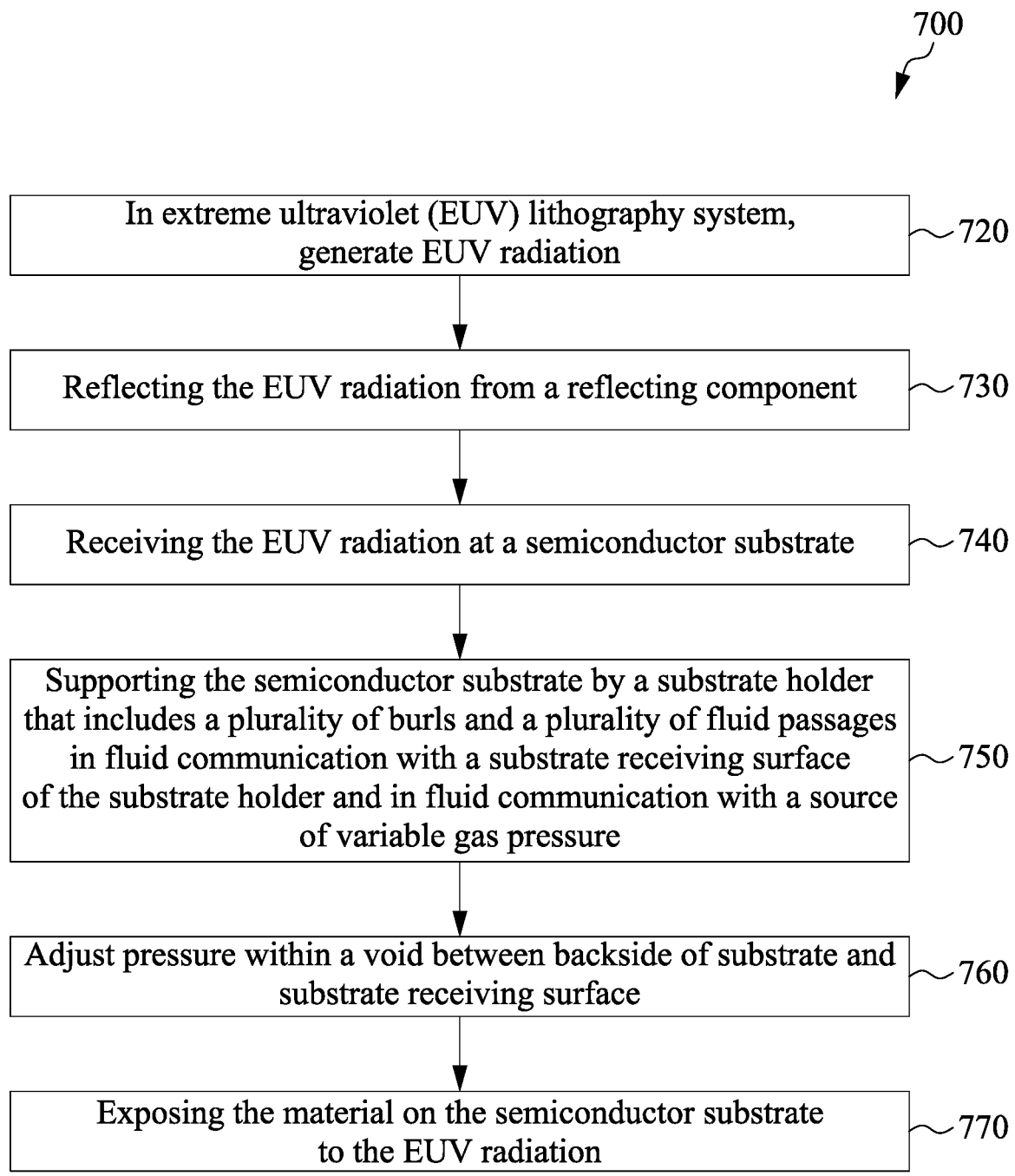
FIG. 7 is a flowchart illustrating a method according to an embodiment of the present disclosure.

Referring to FIG. 7, a method 700 in accordance with embodiments of the present disclosure for exposing a material on a semiconductor substrate in an UV photolithography system is illustrated and described below with reference to FIGS. 1, 2A, 2B and 4A. The method 700 includes generating UV radiation, e.g., EUV radiation, in step 720. EUV radiation can be generated, for example, utilizing the radiation source 102 of FIG. 1 as described above. The UV radiation is reflected from a reflecting component at step 730. An example of a reflecting component suitable for reflecting the EUV radiation is a mask 108 as described above. Mask 108 reflects UV radiation as described above. At step 740, UV radiation is received at a semiconductor substrate. An example of a semiconductor substrate is semiconductor substrate 116 described above. Method 700 includes step 750 of supporting a semiconductor substrate by substrate holder that includes a plurality of support surfaces and a plurality of fluid passages in fluid communication with a substrate receiving surface of a substrate holder and in fluid communication with a source of variable gas pressure. An example of a substrate holder useful in step 750 includes substrate holder 203 described above which includes support surfaces 405*a*-405*d* and channels 440*a*-440*d*. An example of a substrate receiving surface of a substrate holder is substrate contacting surface 220 of substrate holder 203 in FIG. 2B. Fluid passages 444*a*-444*d* in FIG. 4A are examples of fluid passages of the method 700. An example of a source of variable gas pressure is vacuum pump 450 described above. At step 760 of method 700, pressure within a void between the backside of the substrate and the substrate receiving surface is adjusted. An example of a void between the backside of the substrate and the substrate receiving surface include channels 440*a*-440*d* described above. At step 770 of method 700, material on the semiconductor substrate is exposed to the UV radiation. An example of a material on a semiconductor substrate that is exposed to the UV radiation in step 770 includes a UV sensitive photoresist.

While various embodiments have been described above with reference to a vacuum pump 450, in other embodiments, the vacuum pump 450 can be replaced with a pump capable of providing positive pressure to the voids between the backside of the substrate and the substrate receiving surface. In such embodiments, a positive pressure can be provided to the voids to disrupt material that may have accumulated in the voids, thus making them easier to remove from the voids. For example, in some embodiments, the pump provides alternating positive and negative pressures to alternate between a material dislodging step and a material removing step.

In one embodiment, the present disclosure describes a substrate holder system that includes a support device. The support device is coupled to a substrate by a substrate holder. The substrate holder includes a plurality of support surfaces, e.g., burls, and a plurality of fluid passages in fluid communication with a substrate receiving surface of the substrate holder. The plurality of fluid passages are also in fluid communication with a source of variable pressure gas. The plurality of fluid passages are between the plurality of support surfaces. The system further includes a pedestal coupled to the support device. The pedestal includes a gas flow path in fluid communication with one or more of the plurality of fluid passages. The pedestal is also in fluid communication with the source of variable pressure gas.

According to a second aspect of embodiments disclosed herein, there is provided a method that includes generating EUV radiation in an EUV lithography system and reflecting the generated extreme ultraviolet radiation from a mask. The extreme ultraviolet radiation reflected by the mask is received at a semiconductor substrate. The semiconductor substrate is supported by substrate holder that includes a plurality of burls and a plurality of fluid passages. The plurality of fluid passages are in fluid communication with a substrate receiving surface of the substrate holder. The plurality of fluid passage are also in fluid communication with a source of a variable gas pressure. In the method, a pressure within a void between the backside of the substrate and the substrate receiving surface is adjusted. Non-gaseous material from the void is passed through one or more of the plurality of fluid passages. In some embodiments in accordance with this aspect of the present disclosure, the method is part of a process for cleaning the substrate receiving surface of the substrate holder.

According to a third aspect of embodiments disclosed herein, there is provided a method that includes generating UV radiation in an UV lithography system. The UV radiation can be ultraviolet radiation or extreme ultraviolet radiation. The ultraviolet radiation is reflected by the reflecting component of the UV lithography system and is directed toward a semiconductor substrate. The semiconductor substrate is supported by substrate holder that includes a plurality of support surfaces and a plurality of fluid passages. The plurality of fluid passages are in fluid communication with a substrate receiving surface of the substrate holder. The plurality of fluid passages are also in fluid communication with a source of a variable gas pressure. In the method, a pressure within a void between the backside of the substrate and the substrate receiving surface is adjusted and material on the semiconductor substrate is exposed to the extreme ultraviolet radiation received at the semiconductor substrate.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
in an extreme ultraviolet (EUV) lithography system, generating EUV radiation;
reflecting the extreme ultraviolet radiation from a mask;
receiving the extreme ultraviolet radiation, reflected by the mask, at a semiconductor substrate;
supporting the semiconductor substrate by a substrate holder, the substrate holder including a plurality of burls and a plurality of fluid passages in fluid communication with a substrate receiving surface of the substrate holder and in fluid communication with a source of variable gas pressure;
adjusting pressure within a void between a backside of the semiconductor substrate and the substrate receiving surface;
passing a non-gaseous material from the void between a backside of the substrate and the substrate receiving surface through one or more of the plurality of fluid passages; and
exposing material on the semiconductor substrate to the extreme ultraviolet radiation received at the semiconductor substrate.

2. The method of claim 1, wherein adjusting pressure within the void between the backside of the semiconductor substrate and the substrate receiving surface includes reducing the pressure in the void.

3. The method of claim 1, wherein adjusting pressure within the void between the backside of the semiconductor substrate and the substrate receiving surface includes increasing the pressure in the void.

4. The method of claim 1, wherein adjusting pressure within the void between the backside of the semiconductor substrate and the substrate receiving surface includes alternatively increasing the pressure within the void and decreasing the pressure within the void.

5. The method of claim 1, wherein passing a non-gaseous material from the void through one or more of the plurality of fluid passages includes passing a solid material through one or more of the plurality of fluid passages.

6. The method of claim 1, wherein supporting the semiconductor substrate by the substrate holder includes generating an electrostatic force and applying the electrostatic force to the semiconductor substrate.

7. The method of claim 1, wherein the plurality of fluid passages include a cross-sectional area that varies along a first axis, the plurality of fluid passages are arranged along a second axis transverse to the first axis.

8. A method, comprising:
in an ultraviolet (UV) lithography system, generating UV radiation;
reflecting the ultraviolet radiation from an ultraviolet radiation reflecting component of the ultraviolet lithography system;
receiving the ultraviolet radiation, reflected by the ultraviolet radiation reflecting component, at a semiconductor substrate
supporting the semiconductor substrate by a substrate holder, the substrate holder including a plurality of support surfaces and a plurality of fluid passages in fluid communication with a substrate receiving surface of the substrate holder and in fluid communication with a source of variable gas pressure;
adjusting pressure within a void between a backside of the semiconductor substrate and the substrate receiving surface; and
exposing material on the semiconductor substrate to the ultraviolet radiation received at the semiconductor substrate.

9. The method of claim 8, wherein the generating UV radiation includes generating extreme ultraviolet radiation.

10. The method of claim 8, wherein adjusting pressure within the void between the backside of the semiconductor substrate and the substrate receiving surface includes drawing gas into one or more of the plurality of fluid passages, the plurality of fluid passages being located between the plurality of support surfaces.

11. The method of claim 8, wherein adjusting pressure within the void between the backside of the semiconductor substrate and the substrate receiving surface includes drawing gas into one or more of the plurality of fluid passages, the plurality of fluid passages located in a support surface.

12. The method of claim 8, wherein adjusting pressure within the void between the backside of the semiconductor substrate and the substrate receiving surface includes reducing the pressure in the void.

13. The method of claim 8, further comprising dislodging a non-gaseous material from one or more of the plurality of support surfaces into a trough between the support surfaces.

14. The method of claim 13, further comprising passing a non-gaseous material from the void between the backside of the semiconductor substrate and the substrate receiving surface through one or more of the plurality of fluid passages.

15. A substrate holder subsystem in an ultraviolet lithography system, the ultraviolet lithography system comprising:
an ultraviolet radiation source;
projection optics; and
the substrate holder subsystem including:
a support device;
a source for providing a vacuum gas pressure;
a substrate holder configured to couple a substrate to the support device, the substrate holder including a plurality of support surfaces in a plurality of circles that are arranged concentrically, and a plurality of fluid passages in fluid communication with a substrate receiving surface of the substrate holder and in fluid communication with the source for providing a vacuum gas pressure, the plurality of fluid passages being located between the plurality of support surfaces; and a pedestal coupled to the support device, the pedestal including a gas flow channel in fluid communication with one or more of the plurality of fluid passages and in fluid communication with the source for providing a vacuum gas pressure.

16. The substrate holder subsystem of claim 15, wherein two of the plurality of support surfaces are separated by a trough and one or more of the plurality of fluid passages is located in the trough.

17. The substrate holder subsystem of claim 16, wherein the one or more of the plurality of fluid passages includes an opening at the bottom of the trough.

18. The substrate holder subsystem of claim 16, wherein the one or more of the plurality of fluid passages includes an opening at a sidewall of the trough.

19. The substrate holder subsystem of claim 15, wherein one or more of the plurality of fluid passages includes a longitudinal axis that forms an angle with a first axis, the plurality of fluid passages are arranged along a second axis transverse to the first axis.

20. The substrate holder subsystem of claim 15, wherein the source for providing a vacuum gas pressure is a vacuum pump.

* * * * *